US005368964A

United States Patent [19]

Adachi et al.

[11] Patent Number: 5,368,964

[45] Date of Patent: Nov. 29, 1994

[54] PROCESS FOR THE PRODUCTION OF A LITHOGRAPHIC PRINTING PLATE WITH BEVELED END PARTS

[75] Inventors: Keiichi Adachi; Hiromichi Tachikawa, both of Shizuoka, Japan

[73] Assignee: Fuji Photo Film Co., Ltd., Kanagawa, Japan

[21] Appl. No.: 157,299

[22] Filed: Nov. 26, 1993

[30] Foreign Application Priority Data

Nov. 27, 1992 [JP] Japan .................................. 4-318574

[51] Int. Cl.$^5$ ........................ G03G 13/28; G03F 7/00

[52] U.S. Cl. ........................................ 430/49; 430/300; 430/309; 430/327

[58] Field of Search .................. 430/49, 300, 309, 327

[56] References Cited

FOREIGN PATENT DOCUMENTS 46754 3/1982 Japan .
79227 4/1986 Japan .................................. 430/327
74063 4/1988 Japan .................................. 430/309
61654 3/1990 Japan .
66566 3/1990 Japan .

*Primary Examiner*—Roland Martin
*Attorney, Agent, or Firm*—Sughrue, Mion, Zinn, Macpeak & Seas

[57] ABSTRACT

Prevention of printing stains occurring on positions corresponding to the end parts of the printing plate in the case of printing on a rolled paper by a rotary press machine, as in newspaper printing can be accomplished by a process for the production of a lithographic printing plate, which comprises subjecting a lithographic printing plate transported in a predetermined direction by a transporting means to a beveling treatment of end parts thereof and then subjecting the beveled parts to a treatment for rendering hydrophilic.

8 Claims, 8 Drawing Sheets

PROCESS FOR THE PRODUCTION OF A LITHOGRAPHIC PRINTING PLATE WITH BEVELED END PARTS

BACKGROUND OF THE INVENTION

1. Field of the Invention

This invention relates to a process and apparatus for the production of a lithographic printing plate free from printing stains at end parts.

2. Description of the Prior Art

PS plates using light-sensitive agents of positive type, comprising, as predominant components, diazo compounds and phenol resins, or light-sensitive agents of negative type, comprising, as predominant components, acrylic monomers or prepolymers have been put to practical use as a lithographic offset printing plate, but subjected to plate making by contact exposure of a previously image-recorded film precursor because of the low sensitivity thereof.

On the other hand, a copy input, correction, edition, layout and paging, from first to last, have lately been computer-operated with progress of the computer image processing, the storage of large capacity data and the data communication technique, and an electronic edition system has been put to practical use in which an output is promptly attained in a terminal plotter in a remote place by a high speed communication network or satellite communication.

In particular, an electronic edition system is highly required in the field of newspaper printing needing promptness. In the field of subjecting an original copy to storage in the form of a film and as occasion demands, reproducing a printing plate, too, it is considered at the present time that with progress of large capacity recording media such as optical disks, an original is stored as digital data in these recording media.

However, a printing plate of such a direct type that a printing plate is directly prepared from an output of a terminal plotter has hardly been used and the fact is that even where an electronic edition system is operated, an output is effected on a photographic film of silver salt, which is then subjected to contact exposure on a PS plate to prepare a printing plate. One reason therefor is that it is very difficult to develop a printing plate of direct type having such a high sensitivity as capable of preparing a printing plate in a practical period of time by a light source of output plotter (e.g. He-Ne laser, semiconductor laser, etc.).

An electrophotographic light-sensitive material has been taken into consideration as a light-sensitive material having such an optical sensitivity as capable of providing a printing plate of direct type. Preparation of a printing plate by electrophotography has already been known as a method comprising forming a toner image and removing a photoconductive layer on a non-image area. For example, electrophotographic lithographic printing plates are described in Japanese Patent Publication Nos. 17162/1962, 6961/1963, 7758/1963, 2426/1966, 39405/1971, 19509/1975, 19510/1975, 2437/1977, 145538/1979, 134632/1979, 105254/1980, 153948/1980, 161250/1980, 147656/1982, 161863/1982, etc.

In the above described methods, using a resin capable of being dissolved or swelled in an alkaline solvent and released as a binder resin of an electrophotographic light-sensitive material, a toner image is held as a resist and another area than the toner image is removed to expose a hydrophilic area and obtain a lithographic printing plate.

In the case of printing on a rolled paper by a rotary press machine, as in newspaper printing, using the above described offset printing plate, however, printing stains occur on positions corresponding to the end parts of the printing plate.

As a method of preventing end parts from contamination by a lithographic printing plate coated with a photopolymer, it has been proposed to bevel the end parts of tile lithographic printing plate in Japanese Patent Publication No. 46754/1982. According to this method, however, the problem of the printing stains cannot sufficiently be solved.

In an electrophotographic lithographic printing plate prepared by a process comprising at least statically charging, exposing, developing with a toner, fixing the toner and removing another photoconductive layer than the toner image, the toner adheres to end parts during the toner development to cause printing stains and in the case of reversal development, in particular, the printing stains are remarkable. As a method of preventing such terminal stains, it has been proposed to provide the end parts (side surfaces) of an electrophotographic lithographic printing plate with an insulating resin layer (Japanese Patent Laid-Open Publication No. 178240/1988). That is, it is considered that as one cause of printing stains by a lithographic printing plate obtained by reversal development of an electrophotographic lithographic printing plate, a toner adheres to the end parts of the electrophotographic lithographic printing plate, too, during the reversal development and an ink adheres to these parts during printing, resulting in printing stains. Based on this consideration, an insulating resin is coated onto tile end parts of an electrophotographic lithographic printing plate, whereby the adhesion of the toner, during the reversal development, is prevented. Provision of the end parts with a layer of resin having a higher solubility in an alkaline solution than a resin in a light-sensitive layer has been proposed as described in Japanese Patent Laid-Open Publication Nos. 61654/1990 and 66566/1990, but the problem of staining cannot be solved by this proposal.

In Japanese Patent Laid-Open Publication Nos. 261660/1989, it has been proposed to provide a means for removing a toiler adhered to between a developing section and fixing section, but the toner not still fixed is partly retained and printing staining cannot sufficiently be resolved.

SUMMARY OF THE INVENTION

It is an object of the present invention to provide a process for the production of a lithographic printing plate free from printing stains at end parts, whereby the above described problems of the prior art can be overcome.

It is another object of the present invention to provide an apparatus for the production of a lithographic printing plate free from printing stains at end parts.

It is a further object of the present invention to provide a method of preventing printing stains occurring on positions corresponding to the end parts of the printing plate in the case of printing on a rolled paper by a rotary press machine, as in newspaper printing.

These objects can be attained by a process for the production of a lithographic printing plate, which comprises subjecting a lithographic printing plate transported in a predetermined direction by a transporting means to a beveling treatment of end parts thereof and then subjecting the beveled parts to a treatment for rendering hydrophilic.

BRIEF DESCRIPTION OF THE DRAWINGS

The accompanying drawings are to illustrate the principle and merits of the present invention in detail.

DETAILED DESCRIPTION OF THE INVENTION

Figure 1:
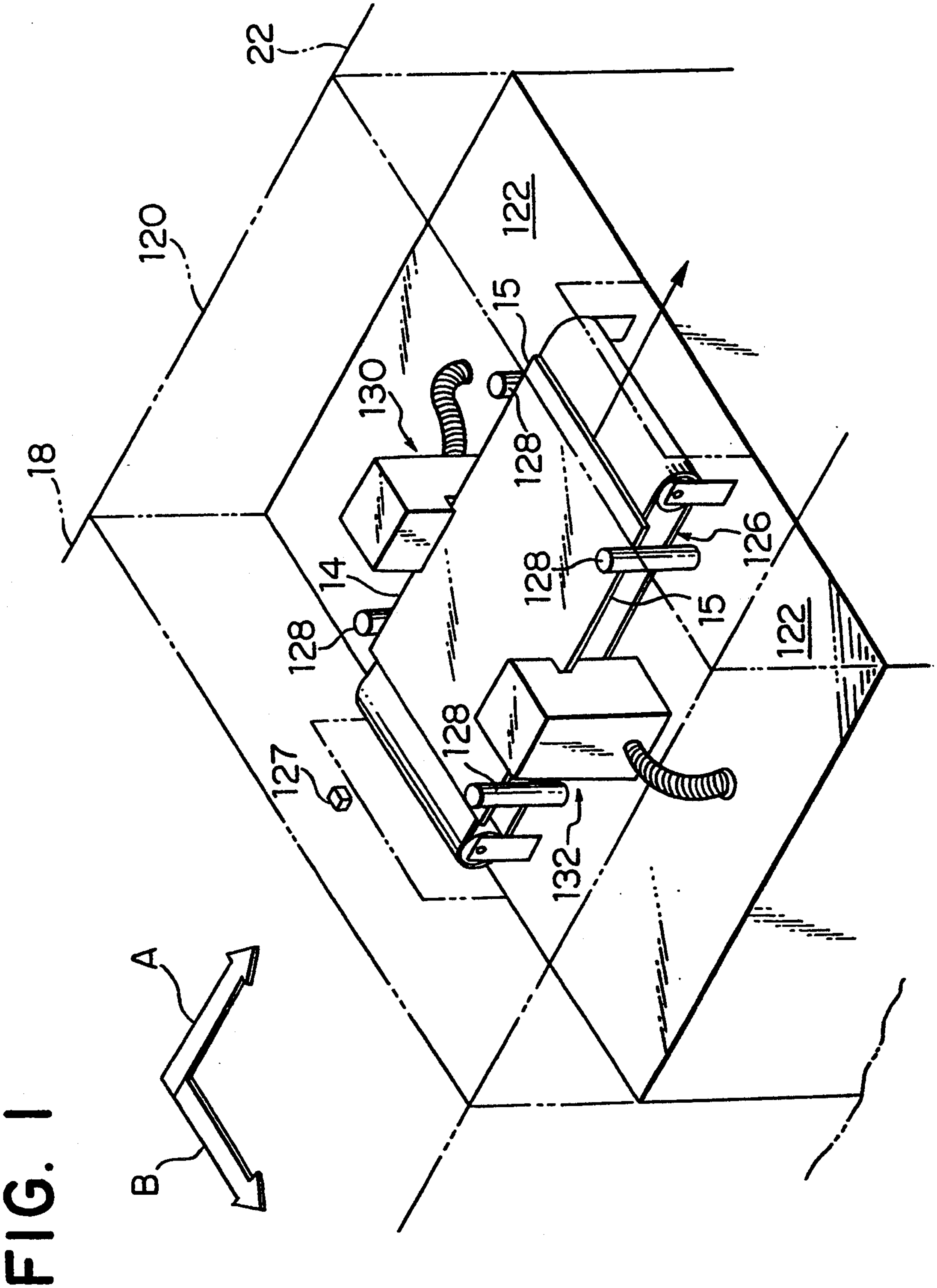
FIG. 1 is a schematic view of one embodiment of an apparatus for carrying a beveling treatment according to the process of the present invention.
Figure 2:
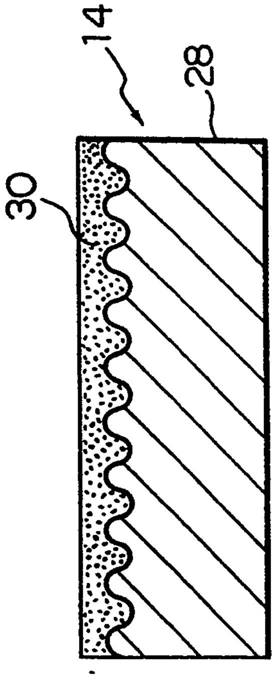
FIG. 2 is a cross-sectional view of one embodiment of a direct printing plate.

The inventors have made various efforts to solve the above described problems and consequently, have found that this object can be achieved by subjecting end parts of a lithographic printing plate transported in a predetermined direction by a transporting means to a beveling treatment and then subjecting the beveled parts to a treatment for rendering hydrophilic.

In a lithographic printing plate coated with a photopolymer, printing staining can be prevented when a treatment for beveling and rendering hydrophilic is carried out in any step of producing a lithographic printing plate and in particular, this effect is remarkable when end parts are subjected to a treatment for beveling and rendering hydrophilic in any step after coating a photopolymer.

Furthermore, in a process for the production of an electrophotographic lithographic printing plate, too, printing staining can be prevented when a treatment for beveling and rendering hydrophilic is carried out in any step after coating a photoconductive layer and in particular, this effect is remarkable when this treatment is carried out in any step after a toner development.

The method of beveling is ordinarily carried out by fixed edge cutting or rotary cutting and in particular, the rotary cutting is preferable.

In the present invention, corner parts of an image-forming surface side in a lithographic printing plate are camfered and the vicinity of the corner parts is subjected to a treatment for rendering hydrophilic. When printing is carried out using the printing plate thus camfered and rendered hydrophilic, the end part is separated at the beveled part and hardly contacted with a paper to maintain well the printing quality. Even when the camfered part is contacted with a paper, ink does not adhere to the end part and printing staining at the end part does not occur because the treatment for rendering hydrophilic is carried out after the beveling treatment.

In the case of a lithographic printing plate coated with a photopolymer, a light-sensitive layer is provided at end parts thereof and retained to result in printing staining. Accordingly, a lithographic printing plate, in particular, which does not lower the printing quality, can be provided by carrying out a beveling treatment after the coating.

On the other hand, in the production of an electrophotographic lithographic printing plate, beveling can be carried out in any step after coating a photoconductive layer and preferably carried out after a toner development. This is considered to be due to that a toner adheres to the end parts of the electrophotographic lithographic printing plate too during the toner development and during printing, an ink adheres to these parts to result in printing staining. The above described adhesion of the ink to the end parts is remarkable during reversal development and in this case, the printing staining at the end parts is remarkable. Thus, there can be provided a lithographic printing plate, in particular, which does not deteriorate the printing quality, by carrying out treatments for beveling the end parts of the lithographic printing plate and rendering hydrophilic the camfared parts in any step after carrying out the toner development. The treatment for rendering hydrophilic after the camfering can be provided as an independent step, but can be carried out in a step of etching or gumming, whereby the plate making process can be simplified.

Figure 3:
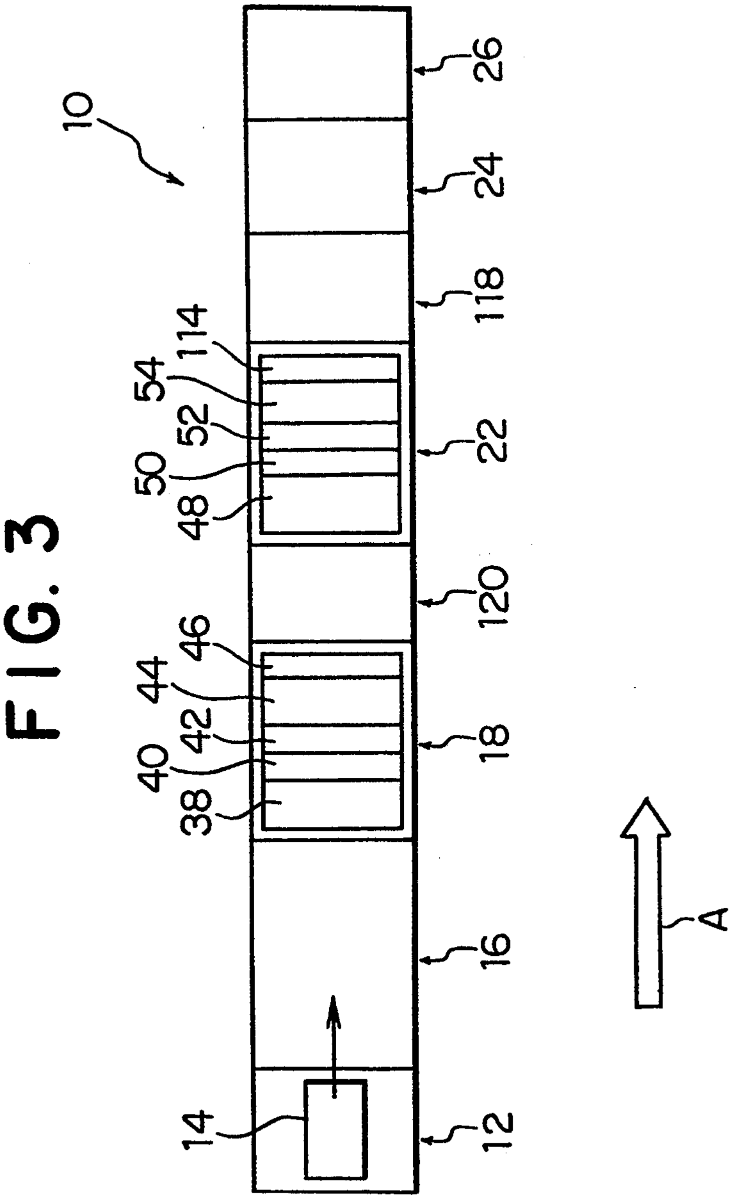
FIG. 3 is a schematic plan view of one embodiment of an electrophotographic plate making apparatus for carrying out the process of the present invention.

As shown in FIG. 3, an electrophotographic plate making apparatus 10, as a lithographic printing plate making apparatus to which the present invention is applied, is provided with a plate feed section 12, image-drawing section 16, developing and fixing processing section 18, beveling processing section 120, elution processing section 118, waiting section 118, puncher section 24 and plate bending section 26.

The plate feed section 12 is arranged at the upper stream (reverse direction of Arrow Direction A of FIG. 3) of the electrophotographic plate making apparatus 10. This plate feed section 12 is provided with a conveyer means (not shown) and a non-exposed plate material 14 is transported in Arrow Direction A of FIG. 3. In the electrophotographic plate making apparatus 10, the direct printing plate 14 is subjected to various processings arranged in the longitudinal direction along Arrow Direction A or reverse direction thereof.

Figure 4:
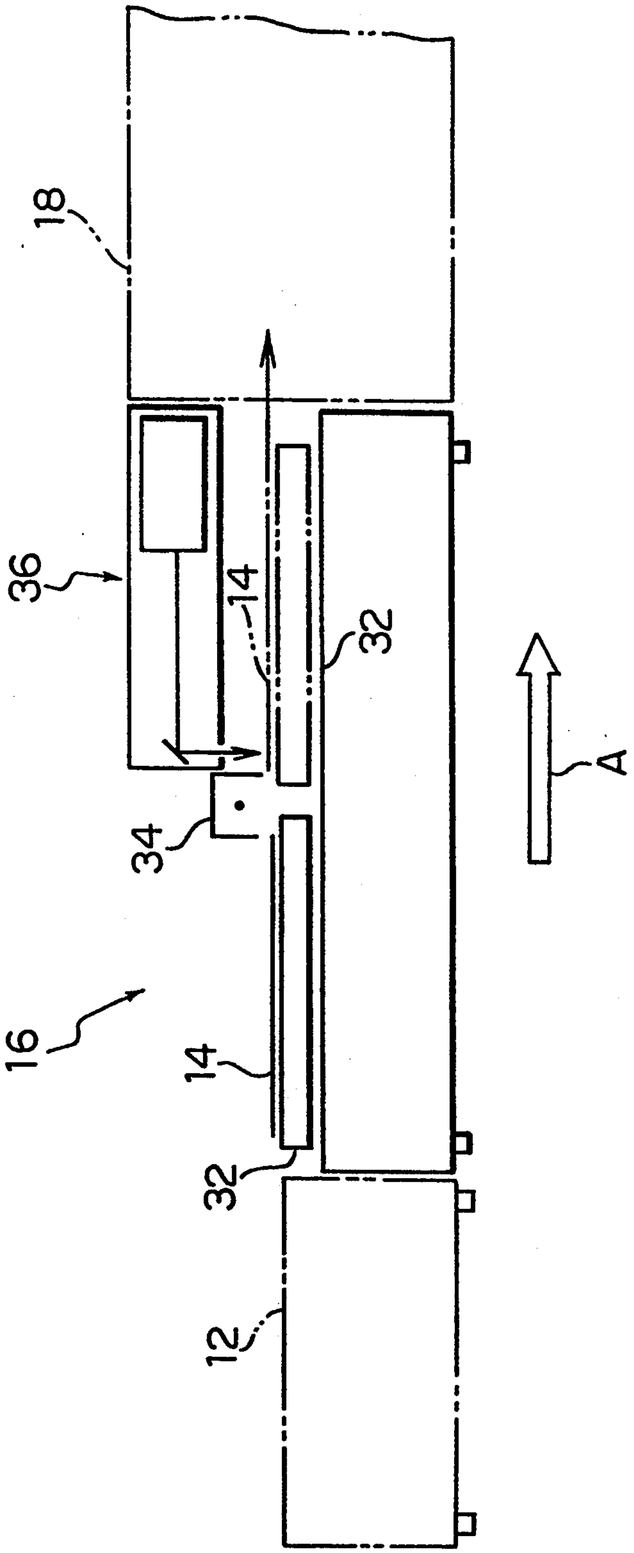
FIG. 4 is a schematic view of one embodiment of a transporting apparatus for transporting a direct printing plate from an image-drawing section and exposing section to a developing and fixing section.

As shown in FIG. 4, the image-drawing section 16 is provided with a transporting base 32 for carrying the direct printing plate 14, the transporting base 32 capable of being moved in Arrow Direction A of FIG. 4 or reverse direction thereof by a transporting means (not shown). An electrification device 34 for electrifying positive a photoconductive light-sensitive layer 30 of the direct printing plate 14 is arranged at an intermediate part of the image-drawing section 16 in Arrow Direction A of FIG. 4 or reverse direction of Arrow Direction A, and an exposing section 36 is arranged at the side of Arrow Direction A of the electrification device 34 in FIG. 4, the exposing section 36 being provided with a semiconductor laser (not shown) for irradiating an image area of the photoconductive light-sensitive layer 30 after electrified with a laser beam and thus subjecting the image to scanning exposure. The image-drawing section 16 is provided with a holding nail (not shown) for taking up and discharging the direct printing plate 14, after exposed, in Arrow Direction A of FIG. 4.

As shown in FIG. 3, toward the side of Arrow Direction A of the image-drawing section 16 in FIG. 3 is arranged the developing and fixing processing section 18, provided with a developing section 38, squeezing section 40, drying section 42, fixing section 44 as a fixing processing section and a transporting means (not shown) for transporting the direct printing plate 14.

The developing section 38 is arranged at the upper stream of the developing and fixing processing section 18, which imparts a liquid developer to the direct printing plate 14 after exposed to actualize an electrostatic latent image on the direct printing plate 14.

Development in the developing section 38 is carried out by reversal development and the direct printing plate 14 positively charged is subjected to development with a toner having positive charge. A toner-adhered part of the direct printing plate 14 becomes lipophilic.

The squeezing section 40 is arranged at the lower stream in the transporting direction of the direct printing plate 14 (Arrow Direction A of FIG. 3) from the developing section 38. The squeezing section 40 is provided with a blower (not shown) for blowing air to the both sides of the printing plate 14.

The drying section 42 is arranged at the lower stream in the transporting direction of the direct printing plate 14 (Arrow Direction A of FIG. 3) from the squeezing section 40. The drying section 42 is provided with a dryer (not shown) for drying the direct printing plate 14 by warm air of the dryer.

The fixing section 44 is arranged at the lower stream in the transporting direction of the direct printing plate 14 (Arrow Direction A of FIG. 3) from the drying section 42. The fixing section 44 is provided with a plurality of heating lamps (not shown) for melting and fixing the toner grains.

The cooling section 46 is arranged at the lower stream in the transporting direction of the direct printing plate 14 (Arrow Direction A of FIG. 3) from the fixing section 44. The cooling section 46 is provided with a fan (not shown) for cooling the direct printing plate 14 by air of the fan.

A beveling section 120 is arranged at the lower stream in the transporting direction of the direct printing plate 14 (Arrow Direction A of FIG. 3) from the cooling section 46. In the beveling section 120, beveling is carried out by a revolving cutter arranged therein.

As shown in FIG. 1, the beveling section 120 is provided with, on a main body base 122, a belt conveyer 126 for transporting the direct printing plate 14, transported from the cooling section 46, in Arrow Direction A of FIG. 1. The width of the belt conveyer 126 is rendered smaller than that of the direct printing plate 14 by a predetermined length. When the direct printing plate 14 is placed on the belt conveyer 126, therefore, a side end part 15 of the direct printing plate 14, in the width direction, is projected outward by a predetermined length from a side end part of the belt conveyer 126.

A photo-sensor 127 is provided at the upper part, upstream to the belt conveyer 126, to detect whether the direct printing plate 14 is transported into the beveling section 120 from the cooling section 46 or not and transmit a detected signal to a control means (not shown). Four guide rollers 128 are axially supported by the main body base near the side of the belt conveyer 126. These guide rollers 128 are respectively brought into contact with the side end parts 15 of the direct printing plate 14 to prevent the direct printing plate 14 from movement in the width direction (Arrow Direction B and reverse direction to Arrow Direction B).

Rotary cutter means 130 and 132 are arranged at both the sides of the belt conveyer 126, near the intermediate position of the transporting direction.

Figure 5:
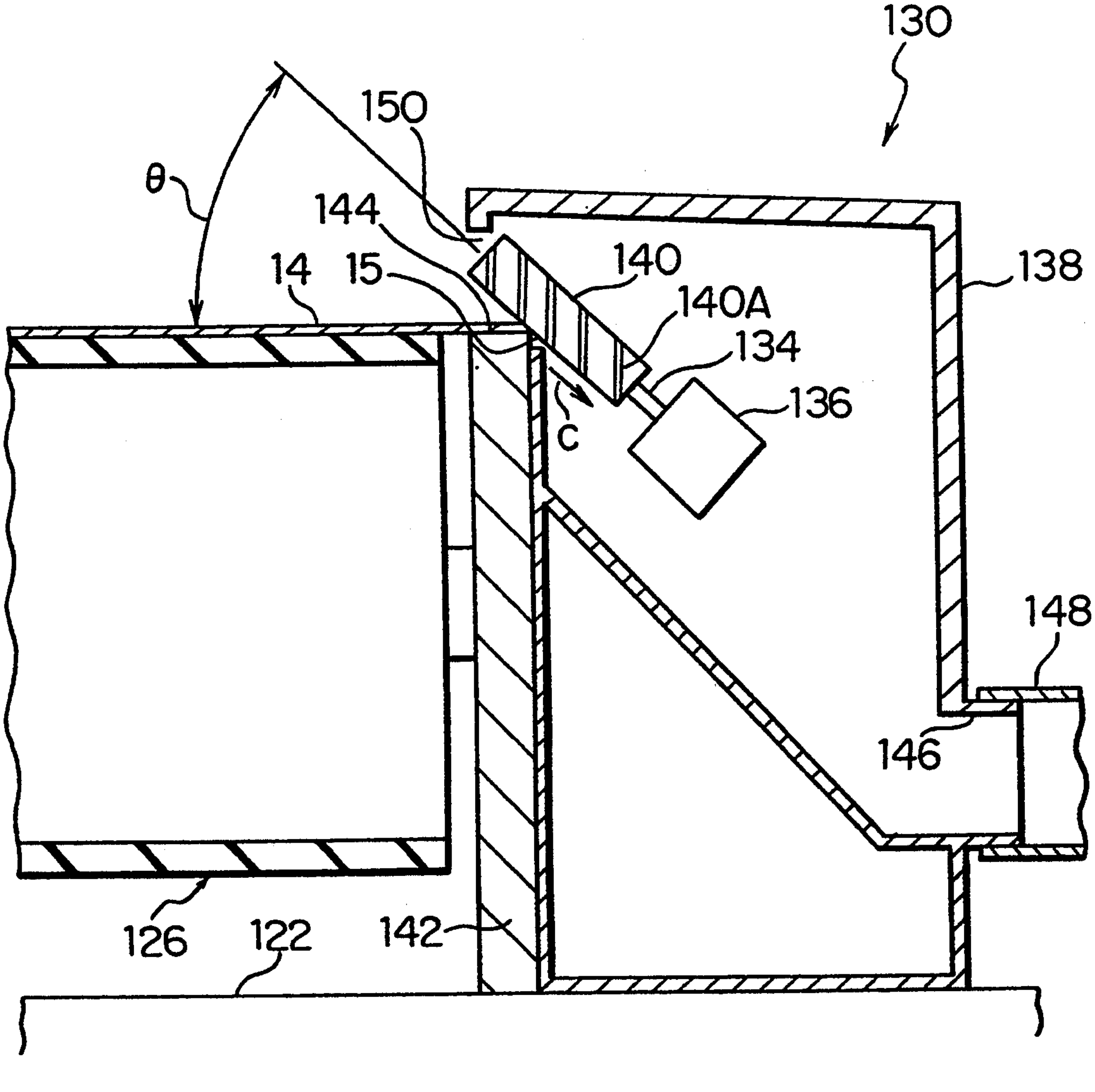
FIG. 5 is a cross-sectional view of one embodiment of a polishing apparatus for carrying out a beveling treatment according to the process of the present invention.

As shown in FIG. 5, the polishing means 130 comprises a box 138 having a slit 150 formed at the side of the belt conveyer 126, in the interior of which the side end part 15 of the direct printing plate 14 is allowed to get from this slit 150.

At the belt conveyer 126 side of the box 138, a printing plate guide 142, formed of a thick material whose upper surface 144 is rendered horizontal, is closely arranged. In the printing plate guide 142, the height of the upper surface 144 is same as that of the upper surface of the belt conveyer 126 so as to support the lower surface of the direct printing plate 14 so that the direct printing plate 14 is not lowered downward.

On the other hand, a motor 136 whose revolving shaft 134 is inclined by a predetermined angle $\theta$ from the horizontal direction is fitted to the upper and inner wall of the box 138. A cemented carbide cutter 140 (Cemented Carbide Cutter Z 171 for Rotary Anglon made by Minitar KK) is fitted to the end of the revolving shaft 134. The cemented carbide cutter 140 is fixed to the revolving shaft 134 in such a manner that when the revolving shaft 134 is normally revolved, an edge 140 A is moved to the side end part 15 (Arrow Direction C) from an image-forming surface side of the direct printing plate 14. Accordingly, fins or wrong patterns are hardly formed on the crossed line of the cutting surface and the image-forming surface of the direct printing plate 14.

On the side surface of the box 138, opposite to the belt conveyer 126 side, a hole 146 is formed at a lower part. The hole 146 is connected with one end of a duct 148 whose other end is connected to a sucking means (not shown). When the sucking means is operated, the outside air is sucked through the sucking slit 150 and foreign matters and cutting dusts in the box 138 are sucked by the sucking means.

On the other hand, the rotary cutter means 132 is composed in the same manner as the rotary cutter means 130 and arranged symmetrically to the axial line of the belt conveyer 126. The construction of the rotary cutter means 132 is the same as that of the rotary cutter means 130 and has the corresponding elements represented by the same marks. The illustration of the rotary cutter means 132 will thus be omitted.

As shown in FIG. 3, an etching section 22 is arranged at the lower stream (Arrow Direction A of FIG. 3) of the transporting direction of the direct printing plate 14 from the beveling section 120.

Figure 7:
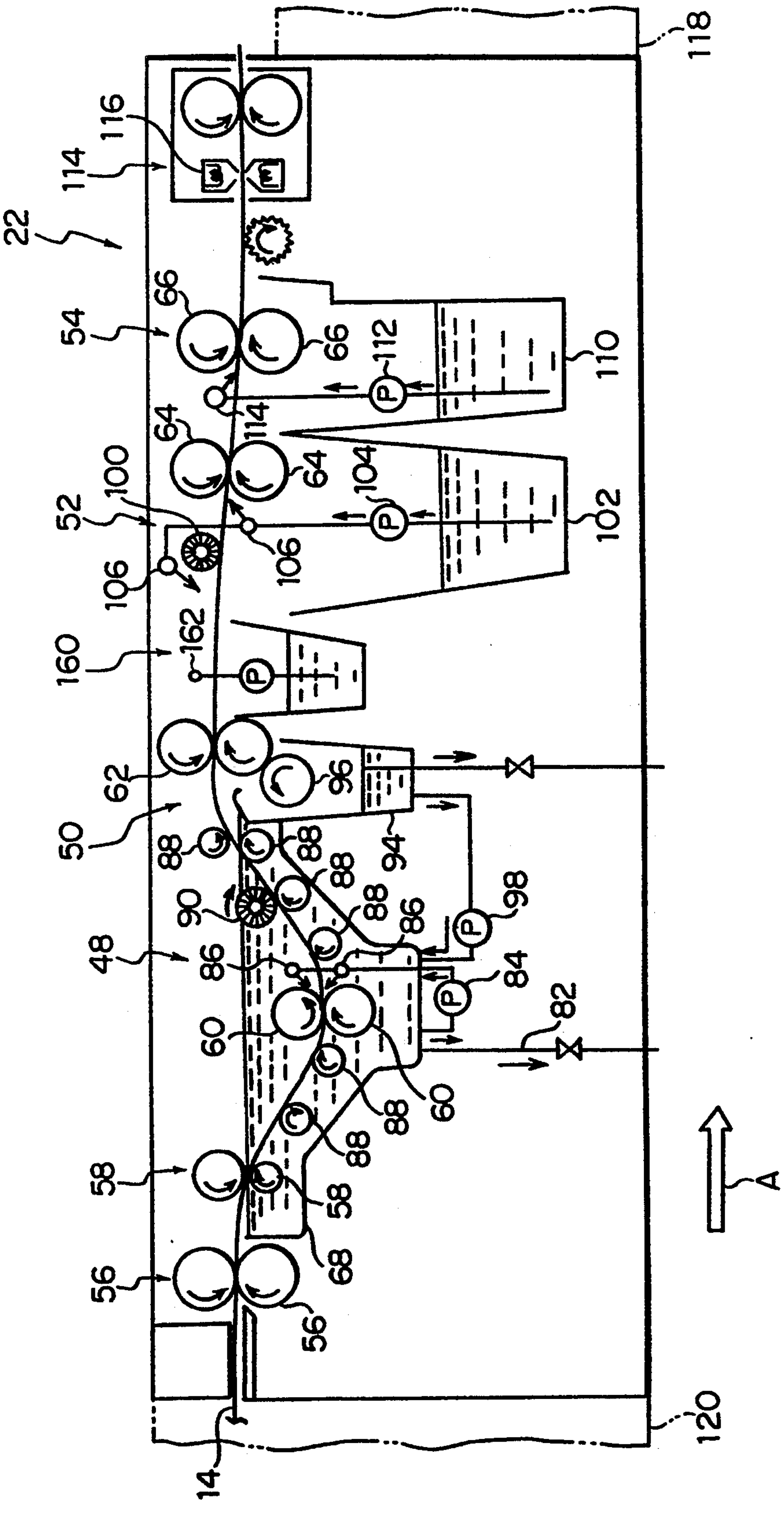
FIG. 7 is a schematic cross-sectional view of one embodiment of a process for subjecting a direct printing plate after beveled to an etching treatment.

An example of an etching section is shown in FIG. 7. The etching section comprises an etching section 48 wherein the direct printing plate 14 is treated with an alkaline solution to etch a photoconductive light-sensitive layer on a non-image area of the direct printing plate 14, a squeezing section 50 for removing the excessive alkaline solution adhered to the direct printing plate 14, a hydrophilic processing section 160 for subjecting the beveled end part to a processing for rendering hydrophilic, a water washing section 52 for water-washing the direct printing plate 14 rendered hydrophilic to remove the alkaline solution, a gum-liquid coating section 54 for coating the water-washed direct printing plate with a gum liquid, a drying section 114 for drying the gum liquid-coated direct printing plate 14 and a plurality of transporting rollers 56, 58, 60, 62, 64 and 66 for holding and transporting the direct printing plate 14. The processing for rendering hydrophilic can be carried out in or between any step after the beveling.

Figure 8:
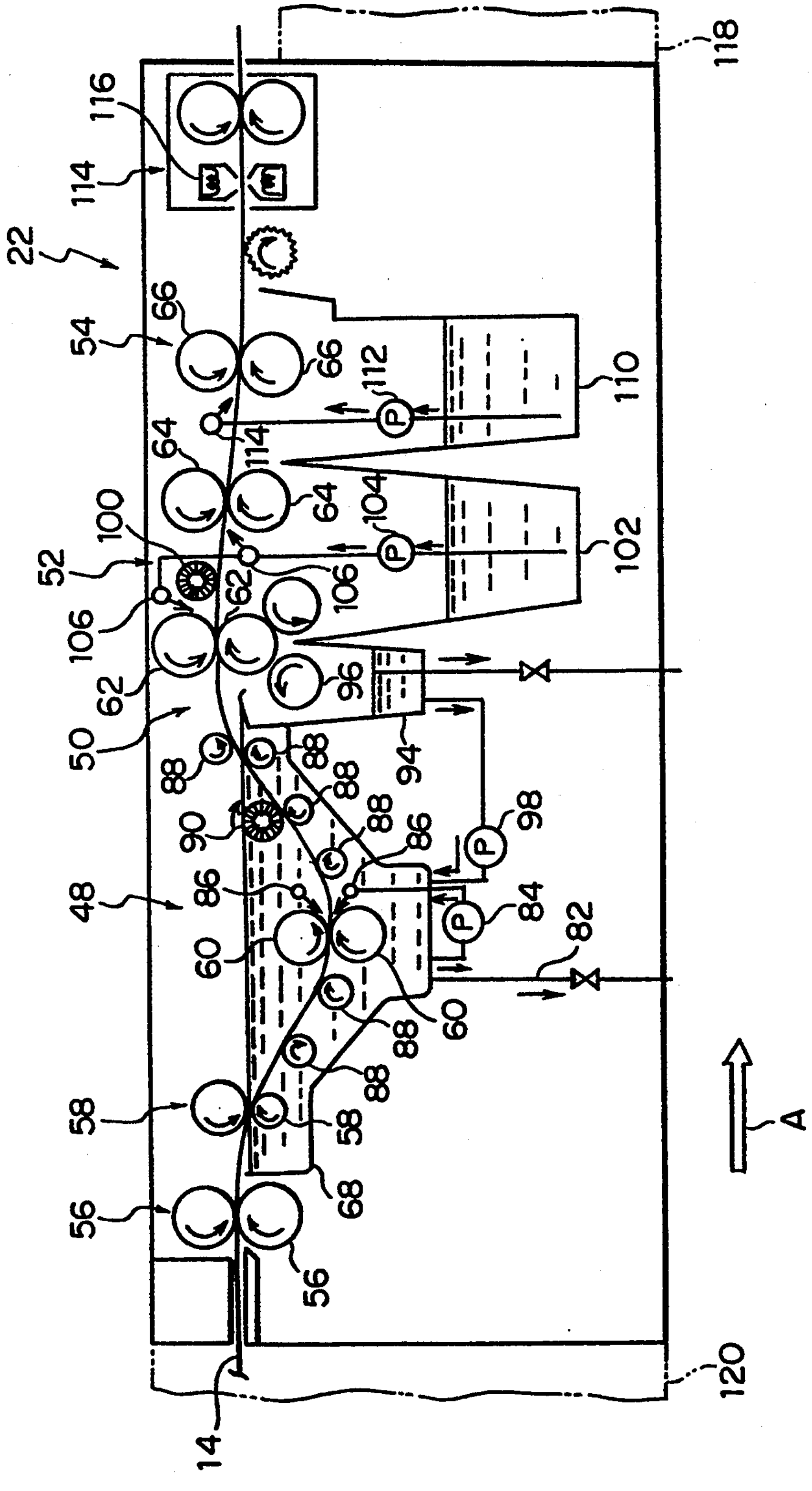
FIG. 8 is a schematic cross-sectional view of another embodiment of a process for subjecting a direct printing plate after beveled to an etching treatment.

An example of another etching section is shown in FIG. 8. The etching section 22 comprises an etching and hydrophilic processing section 48 wherein the direct printing plate 14 is treated with an alkaline solution to etch a photoconductive light-sensitive layer on a non-image area of the direct printing plate 14 (non-image area other than toner image-formed area) and to subject to a hydrophilic processing, a squeezing section 50 for removing the excessive alkaline solution adhered to the direct printing plate 14, a water washing section 52 for water-washing the squeezed direct printing plate 14 to remove the alkaline solution, a gum-liquid coating section 54 for coating the water-washed direct printing plate with a gum liquid, a drying section 114 for drying the gum liquid-coated direct printing plate 14 and a plurality of transporting rollers 56, 58, 60, 62, 64 and 66 for holding and transporting the direct printing plate 14. The processing for rendering hydrophilic can be carried out in or between any step after the rotary cutting treatment.

The transporting rollers 56 are arranged at the upper stream (opposite to Arrow Direction A of FIG. 7) in the etching section 22 and the etching section 48 is arranged at the lower stream (Arrow Direction A of FIG. 7) of the transporting direction of the direct printing plate 14 from the transporting rollers 56. The etching section 48 is provided with an etching tank 68 which is provided with transporting rollers 58 and 60 and a plurality of guide rollers 88. The direct printing plate 14 is transported by the transporting rollers 58 and 60 and guide rollers 88 and immersed in an alkaline solution in the etching tank 68, with which a circulating pump 84 is connected to suck the alkaline solution in the tank and blow it against the direct printing plate 14.

Furthermore, a roller-shaped brush 90 is arranged at a position corresponding to the photoconductive light-sensitive layer 30 of the direct printing plate 14 in the etching tank 68. The brush 90 is connected to a revolving and driving means such as motors (not shown) and revolved by the revolving and driving means. A drainage pipe 82 is connected to the bottom of the dissolving tank 68, whereby the wasted alkaline solution in the tank is discharged via the drainage pipe 82.

A squeezing section 50 is arranged at the lower stream (Arrow Direction A of FIG. 7) of the transporting direction of the direct printing plate 14 from the etching tank 68 and provided with the transporting rollers 62. The squeezing section 50 is provided with a receiving section 94, where the direct printing plate 14 is held by the transporting rollers 62 to remove the alkaline solution adhered to the surface thereof. A roller 96 is arranged at the side of the receiving section 94 to be closely contacted with the transporting roller 62 and the alkaline solution removed by the transporting rollers 62 is dropped via the roller 96 into the receiving section 94, which is further provided with a pump 98 to return the removed alkaline solution to the etching tank 98.

A water-washing section 52 is arranged at the lower stream (Arrow Direction A of FIG. 7) of the transporting direction of the direct printing plate 14 from the etching section 48 and provided with the transporting rollers 64. The water-washing section 52 is further provided with a roller-shaped brush 100 and a water-receiving tank 102. Washing water is accumulated in the water-receiving tank 102, pumped by a pump 104 and blown against the direct printing plate 14 from a nozzle 106. The brush 100 is arranged at a position corresponding to the photoconductive light-sensitive layer 30 of the direct printing plate 14, whereby the photoconductive light-sensitive layer 30 of the direct printing plate 14 can be washed.

A gum liquid coating section 54 is arranged at the lower stream (Arrow Direction A of FIG. 7) of the transporting direction of the direct printing plate 14 from the water washing section 52 and provided with a gum liquid tank 110 in which a gum liquid is accumulated. The gum liquid in the gum liquid tank is sucked by a pump 112 and blown against the direct printing plate 14 from a nozzle 114.

A drying section 114 is arranged at the lower stream (Arrow Direction A of FIG. 7) of the transporting direction of the direct printing plate 14 from the gum liquid coating section 54 and provided with a dryer 116, whereby to dry the gum-treated direct printing plate 14.

As shown in FIG. 3, a waiting section 118 is arranged at the lower stream (Arrow Direction A of FIG. 3) of the transporting direction of the direct printing plate 14 from the etching section 22, and the direct printing plate 14 after the etching treatment is transported in the waiting section 118, which is provided with a conveyer means (not shown) for conveying the direct printing plate 14 in Arrow Direction A of FIG. 3.

A puncher section 24 is arranged at the lower stream (Arrow Direction A of FIG. 7) of the transporting direction of the direct printing plate 14 from the waiting section 118 and provided with a punch (not shown) for forming a notch to locate the direct printing plate 14 during application thereof.

A plate bending section 26 is arranged at the lower stream (Arrow Direction A of FIG. 7) of the transporting direction of the direct printing plate 14 from the waiting section 118 and provided with a bending means (not shown) for bending, by a predetermined size, both the ends of the direct printing plate 14 in the longitudinal direction.

The function of the preferred embodiment of the present invention will now be illustrated:

As shown in FIG. 3, the direct printing plate 14, not exposed, is arranged in such a manner that the photoconductive layer 30 faces upward and its longitudinal direction is along the transporting direction and transported to the image-drawing section 16 by a conveyer means (not shown). As shown in FIG. 4, in the image-drawing section, the transporting base 32, on which the direct printing plate 14 is placed, is removed in Arrow Direction A of FIG. 4 by a driving means (not shown), during which the photoconductive layer 30 of the direct printing plate 14 on the transporting base 32 is positively electrified by the electrification device 34. When the direct printing plate 14 is transported directly under the exposing section 36, a laser beam corresponding to an original image generated from a semiconductor laser (not shown) is irradiated onto the surface of the photoconductive layer 30. Thus, an incident area irradiated by the laser beam becomes electroconductive and positive charges are removed from the surface of the photoconductive layer 30 at the incident area to form an electrostatic latent image corresponding to an image information.

The direct printing plate 14 having an electrostatic latent image formed is held, at the end parts, by the holding nail (not shown) and transported from the image-drawing section to the developing and fixing processing section 18.

In the developing and fixing processing section 18, toner grains positively electrified in a liquid developer are adhered, at the developing section, to an exposed area on the photoconductive layer 30 of the direct printing plate 14.

When the direct printing plate 14 reaches the squeezing section 40, air is blown against both the surfaces of the direct printing plate 14 and the excessive liquid developer adhered to both the surfaces is removed. Then, the direct printing plate 14 is transported to the drying section 42 and the wetted toner is dried by warm air from the dryer (not shown).

The thus developed direct printing plate 14 is transported to the fixing section 44, where the toner adhered to the direct printing plate 14 is melted, bonded and fixed by heat from the heating lamp (not shown). The direct printing plate 14 heated at the fixing section 44 is cooled by air blowing in the cooling section 46 and then transported to the beveling processing section 120.

As shown in FIG. 1, the direct printing plate 14 transported to the beveling section 120 is further transported in Arrow Direction A of FIG. 1 by the belt conveyer 126 while guiding the side end parts 15 in Arrow Direction B or in the opposite direction to Arrow Direction B by the guide rollers 128.

Figure 6:
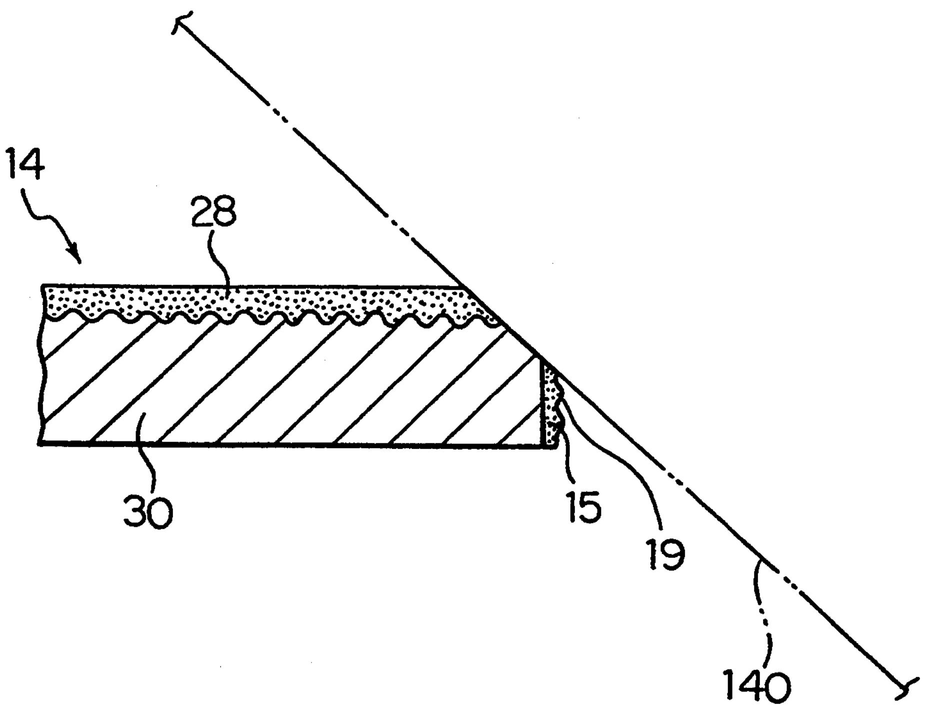
FIG. 6 is a cross-sectional view of one embodiment of a direct printing plate subjected to a beveling treatment according to the process of the present invention.

The side end parts 15 of the transported direct printing plate 14 are passed through the slit 150 of the rotary cutter means 130 and 132 and as shown in FIG. 6, the edge of the cemented carbide cutter 140 revolved by the motor 136 is butted to the corner part at the side of the photoconductive layer 30 on the side end parts 15 of the direct printing plate 14 having the toner adhered, thus effecting cutting and beveling. During cutting, the sucking means (not shown) is operated to suck cutting dust through the duct 148. Since the outside air is sucked through the slit 150 during the above described sucking, the cutting dust is not scattered around the box 138. The beveling size of the direct printing plate 14 is adjusted to about half of the thickness thereof.

The direct printing plate 14 thus beveled is then transported to the etching section 22 by the belt conveyer 126. As shown in FIG. 7, the direct printing plate 14 is held by the transporting rollers 56 and transported to the etching tank 68 where it is immersed in all alkaline solution. In the direct printing plate 14 immersed in the alkaline solution, a toner-free photoconductive layer 30, that is, a non-image area is etched out. During the same time, the photoconductive layer 30 of the direct printing plate 14 is rubbed by the brush 90 to accelerate the etching reaction. As to the toner-free area of the direct printing plate 14, the surface rendered hydrophilic of the electroconductive support 14 is exposed by this etching treatment. Even if cutting dust, etc. is adhered to the direct printing plate 14, it is completely removed with the alkaline solution.

The direct printing plate 14 after the etching treatment is held by the transporting rollers 62 in the squeezing section 50 to squeeze the alkaline solution adhered to the surface. The squeezed alkaline solution is dropped through the roller 96 and accumulated in the receiving part 94. The accumulated alkaline solution in the receiving part 94 is returned to the etching tank 68 by the pump 90.

The direct printing plate 14, subjected to squeezing, is transported to the hydrophilic processing section 160 and a hydrophilic processing solution is blown against the end parts of the direct printing plate 14 from the nozzle 162.

The direct printing plate 14 subjected to the hydrophilic processing is transported to the water-washing part 52, where washing water is blown against it from the nozzle 106. Further, the direct printing plate 14 is rubbed by the brush 100 to completely remove the adhered alkaline solution.

When the direct printing plate 14 is transported to the gum liquid coating section 54, a gum liquid is blown from the nozzle 114 and coated onto the direct printing plate 14. The direct printing plate 14, gum treated, is transported to the drying section and the gum liquid adhered to the direct printing plate 14 is dried. Thus, the non-image area (toner-free area) of the direct printing plate 14 is rendered hydrophilic.

The direct printing plate 14 treated in the etching section 22 is once allowed to stand in the waiting section 118, and after a plate examining operation, it is transported to the puncher section 24, where a notch is formed to locate the direct printing plate 14 during application thereof by punching the direct printing plate 14.

The direct printing plate 14 having a notch for the location formed in the puncher section 24 is subjected to bending of both the ends of the direct printing plate 14 by a predetermined size in the longitudinal direction by the bending means (not shown) in the plate bending section 26. Thus, the process for plate making of the direct printing plate 14 has been completed.

When printing is carried out using the direct printing plate 14 made by the electrophotographic plate making apparatus 10 according to the present invention, as illustrated above, the toner 19 (Cf. FIG. 6) adhered to the side end parts 15 of the direct printing plate 14 is separated through the rotary cutter section and is hard to be in contact with a paper. Even if it is contacted with a paper, the beveled part is rendered hydrophilic and accordingly, no ink adheres thereto.

Furthermore, in this embodiment, the cemented carbide cutter 140 is fixed to the revolving shaft 134 in such a manner that when the revolving shaft 134 is normally revolved, the edge 140 A is moved to the side end part 15 (Arrow Direction C of FIG. 5) from the image-forming surface side of the direct printing plate 14. Accordingly, fins or wrong patterns are hardly formed on the crossed line of the cutting surface and the image-forming surface of the direct printing plate 14 and there is no chance that an ink adheres to the fins or wrong patterns and is transferred. In this embodiment, the toner is fixed to the side end parts 15 of the direct printing plate 14, so the toner is prevented from scattering, and the size (width and length) of the direct printing plate 14 is not changed, so locating can be carried out based on the side end parts 15 of the printing plate, as a standard.

In this embodiment, the cooling section 46 for cooling the direct printing plate 14 is provided at the lower stream of the fixing section 44, but the present invention is not limited to this embodiment and the cooling section can be omitted. In this case, the transporting rate of the direct printing plate 14 in the beveling processing section 120 is decreased, so that the direct printing plate 14 is naturally cooled in the beveling processing section 120.

Figure 9:
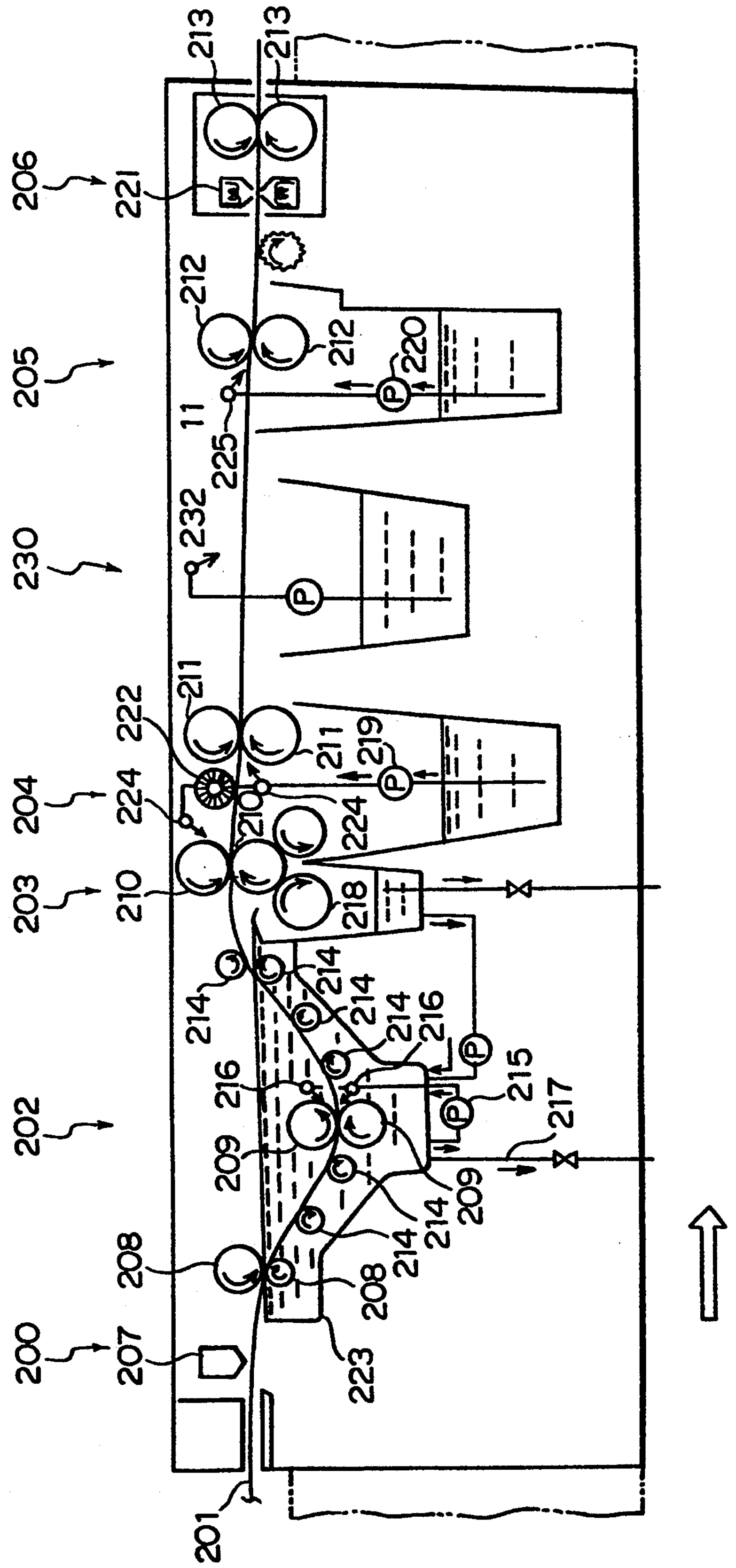
FIG. 9 is a schematic cross-sectional view of one embodiment of an apparatus for treating a lithographic printing plate coated with a photopolymer of the present invention.

FIG. 9 is a schematic cross-sectional view of one embodiment of an apparatus for treating a lithographic printing plate coated with a photopolymer of the present invention. The lithographic printing plate coated with the photopolymer and subjected to surface exposure is transported to a beveling section 200 by a transporting means (not shown), where the end parts of the lithographic printing plate 201 coated with the photopolymer are beveled by a rotary cutter means 207. In a developing section 202, the lithographic printing plate 201 coated with the photopolymer is subjected to a treatment with an alkaline solution to etch out the light-sensitive layer on a non-exposed area. An excessive alkaline solution adhering to the lithographic printing plate 201 coated with the photopolymer is then squeezed and removed in a squeezing section 203 and the thus squeezed lithographic printing plate 201 coated with the photopolymer is washed with water to remove the alkaline solution in a water-washing section. The lithographic printing plate 201 coated with the photopolymer is then subjected to a treatment for rendering hydrophilic the beveling end parts thereof in a hydrophilic processing section 204 and coated with a gum liquid in a gum-coating section 205. In each of these processing sections, transporting rollers 208, 209, 210, 211, 212, 213 and 214 for holding and transporting the lithographic printing plate coated with the photopolymer are provided and driven by motors (not shown).

The construction of an electrophotographic printing plate to which the apparatus of the present invention can be applied will be illustrated.

As the electroconductive base plate of the electrophotographic printing plate of the present invention, there can be used various support materials, i.e. electroconductive plates having hydrophilic surfaces, for example, plastic sheets having electroconductive surfaces, papers rendered solvent-impermeable and electroconductive, aluminum plates, zinc plates, bimetal plates such as copper-aluminum plates, copper-stainless steel plates, chromium-copper plates, etc., trimetal plates such as chromium-copper-aluminum plates, chromium-lead-iron plates, chromium-lead-stainless steel plates, etc. The thickness of the base plate is generally 0.1 to 3 mm, preferably 0.1 to 0.5 mm. Above all, aluminum plates are preferably used. The aluminum plates used in the present invention are composed of pure aluminum consisting of aluminum as a predominant component or aluminum alloys containing micro amounts of foreign atoms, whose compositions are not particularly specified. Any materials of the prior art can suitably be used therefor.

These aluminum plates can be subjected to sand setting or anodic oxidation in known manner. Furthermore, an aluminum plate is preferably used, which is obtained by subjecting to an anodic oxidation treatment and then to an immersion treatment with an aqueous solution of an alkali metal silicate, as disclosed in Japanese Patent Publication No. 5125/1972. An electrodeposition of a silicate is effective as disclosed in US Patent No. 3658662 and a treatment with polyvinylsulfonic acid is suitable as disclosed in German Patent No. 1621478.

A number of compounds well known in the art can be used as the photoconductive material in the present invention, for example, low molecular weight photoconductive materials such as triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalkone derivatives, N,N-bicarbazyl derivatives, oxazole derivatives, styrylanthracene derivatives, fluororenone derivatives, hydrazone derivatives, benzidine derivatives, stilbene derivatives, etc., and high molecular compounds such as polyvinylcarbazole and derivatives thereof.

For the purpose of improving the sensitivity of a photoconductor and obtaining a desired light-sensitive wavelength range, various pigments, sensitizing dyes, etc. can be used, illustrative of which are monoazo-, bisazo- and trisazo-pigments, phthalocyanine pigments such as metallic phthalocyanines or non-metallic phthalocyanines, naphthalocyanine pigments, perylene pigments, indigo- and thioindigo-derivatives, quinacridone pigments, polycyclic quinone pigments, bisbenzimidazole pigments, squalium salt pigments, azulenium salt pigments and the like.

As the sensitizing dye, there can be used known compounds as described in "Zokanzai (SEnsitizer)" page 125, published by Kodansha (1987), "Denshi-Shashin (Electrophotography)" 12 No. 9 (1973), "Yuki Gosei Kagaku (Organic Synthetic Chemistry)" 24, No. 11, page 1010 (1966), etc., for example, pyrylium dyes, triarylmethane dyes, cyanine dyes, styryl dyes and the like.

These dyes can be used individually or in combination. These charge producing agents are capable of not only producing charges, but also preparing, in the case of having a charge transporting capacity, a light-sensitive material as a basic material by dispersing the charge producing agent in a binder and coating. That is, joint use of an organic photoconductive compound known as a charge transporting agent is not always required.

The binder resin used for an electrophotographic printing plate precursor in the present invention is not particularly specified but include any material such that non-image areas can be etched and removed after toner development. In view of the environmental pollution and ease of handling, on the other hand, an alkaline solution is preferably used as an etching solution.

As the binder resin, therefore, it is preferable to use materials which can be removed by an aqueous alkaline solution, for example, copolymers of (meth)acrylic acid esters, styrene, vinyl acetate, etc. with carboxylic acid-containing monomers or acid anhydride group-containing monomers such as (meth)acrylic acid, itaconic acid, crotonic acid, maleic acid, maleic anhydride, maleic anhydride monoalkyl esters, fumaric acid, etc., i.e., styrene/maleic anhydride copolymers, styrene/maleic anhydride monoalkyl ester copolymers, (meth)acrylic acid/(meth)acrylic acid ester copolymers, styrene/(meth)acrylic acid/(meth)acrylic acid ester copolymers, vinyl acetate/crotonic acid copolymers, vinyl acetate/crotonic acid/(meth)acrylic acid ester copolymers, vinyl acetate/vinyl esters of $C_2$–$C_{18}$ carboxylic acids/crotonic acid copolymers; copolymers containing monomers of (meth)acrylic acid amides, vinylpyrrolidone, phenolic hydroxyl group, sulfonic acid group, sulfonamide group, sulfonimide group, etc.; novolak resins obtained by condensing phenol, o-cresol, m-cresol or p-cresol with formaldehyde or acetaldehyde; polyvinyl acetal resins such as partially saponified vinyl acetate resins, polyvinyl butyral, etc. and polyurethane reins containing carboxylic acid.

Above all, the copolymers of (meth)acrylic acid esters, styrene, vinyl acetate, etc. with carboxylic acid-containing monomers such as (meth)acrylic acids, etc. are preferably used because of being excellent in electrophotographic property, etching property, printing property, etc.

More preferably, there can be used copolymers of (meth)acrylic acid with (meth)acrylic acid esters of aliphatic or aromatic alcohols such as methyl alcohol, ethyl alcohol, propyl alcohol, isopropyl alcohol, butyl alcohol, isobutyl alcohol, sec-butyl alcohol, tert-butyl alcohol, n-amyl alcohol, iso-amyl alcohol, hexyl alcohol, octyl alcohol, benzyl alcohol, phenethyl alcohol and the like.

The electrophotographic printing plate used in the present invention can be obtained by coating an electroconductive base plate with a photoconductive layer in conventional manner. For the preparation of the photoconductive layer, any of known methods can be used, for example, comprising incorporating components for composing the photoconductive layer in a same layer or comprising separately using a charge carrier producing material and charge carrier transporting material in different layers.

To the photoconductive layer can optionally be added, in addition to a photoconductive compound and binder resin, a plasticizer, surfactant, matting agent and other additives for the purpose of improving the flexibility of the photoconductive layer and the property of the coated surface. These additives can be added in such a proportion that the electrostatic property and etching property of the photoconductive layer are not deteriorated.

In the electrophotographic printing plate used in the present invention, an intermediate layer can optionally be provided so as to improve the bonding strength between the above described electroconductive base plate and photoconductive layer, and the electric property, etching property, printing property, etc. of the photoconductive layer.

As the intermediate layer, there can be used casein, polyvinyl alcohol, ethyl cellulose, polyacrylic acid, monoethanolamine, diethanolamine, triethanolamine tripropanolamine and hydrochlorides, oxalates and phosphates thereof, various amine acids, for example, monoamino monocarboxylic acids such as alanine.

An overcoat layer capable of being removed during etching the photoconductive layer can optionally be provided on the photoconductive layer for the purpose of improving the electric property of the photoconductive layer, the image property during toiler development, the adhesiveness to a toner, etc. The overcoat layer can be provided by mechanically matting or by coating a resin layer containing a matting agent.

The thickness of the photoconductive layer is preferably in the range of 0.1 to 30 μm, preferably 9.5 to 10 μm, since if less than the lower limit, a surface potential necessary for development cannot be obtained by electrification, while if more than the upper limit, side etching tends to occur often and a good printing plate cannot be obtained.

The contents of a binder resin and a photoconductive compound in the photoconductive layer are preferably in the range of 0.05 to 1.2 part by weight, more preferably 0.1 to 1.0 part of the photoconductive compound per 1 part by weight of the binder resin, since if the content of the photoconductive compound is less than the lower limit, the sensitivity is lowered.

In the present invention, the toner for forming an image part is not particularly limited, but any of known toners having a resist property to an etching solution, illustrated below, can be used and those each containing a component having a resist property to an etching solution are preferable.

Examples of the resin component include acrylic acid resins from methacrylic acid, acrylic acid and their esters, vinyl acetate resins, copolymer resins of vinyl acetate and ethylene or vinyl chloride, vinyl chloride resins, vinylidene chloride resins, vinyl acetal resins such as polyvinyl acetal, polystyrene, copolymer resins of styrene and butadiene, methacrylic acid esters, etc., polyethylene, polypropylene and chlorinated products thereof, polyester resins (e.g. polyethylene terephthalate, polyethylene isophthalate, polycarbonates of bisphenol A, etc.), phenol resins, xylene resins, alkyd resins, vinyl-modified alkyd resins, gelatin, cellulose ester derivatives such as carboxymethyl cellulose, wax, polyolefins, higher fatty acids and the like.

As the etching solution for removing a photoconductive insulating layer on a toner non-image area after forming a toner image, any solvent capable of removing the photoconductive insulating layer can be used, but an alkaline solvent is preferably used without limiting to the same. The alkaline solvent used herein includes aqueous solutions containing alkaline compounds, organic solvents containing alkaline compounds and mixtures of aqueous solutions and organic solvents containing alkaline compounds.

As the alkaline compound, there can be used suitable organic and inorganic alkaline compounds, for example, sodium hydroxide, potassium hydroxide, sodium carbonate, sodium silicate, potassium silicate, sodium metasilicate, potassium metasilicate, sodium phosphate, potassium phosphate, ammonia and amino alcohols such as monoethanolamine, diethanolamine, triethanolamine, etc. As the solvent of the etching solution, water or a number of organic solvents can be used as described above, but an etching solution consisting of water, as a predominant component, is preferably used in view of offensive smell and environmental pollution.

To the etching solution consisting of water can optionally be added various organic solvents. Preferable organic solvents are lower alcohols and aromatic alcohols such as methanol, ethanol, propanol, butanol, benzyl alcohol, phenethyl alcohol, etc. ethylene glycol, diethylene glycol, triethylene glycol, polyethylene glycol, Cellosolve and the like.

To the etching solution can optionally be added surfactants, defoaming agents, preservatives and other various additives.

The hydrophilic processing agent used in the present invention will be illustrated. For rendering a beveled part hydrophilic, a known hydrophilic processing agent can be used, but in particular, a processing with a hydrophilic macromolecule or an acid or alkali is effective.

Examples of the specific macromolecule are natural macromolecules, i.e. starches such as sweet potato starch, potato starch, tapioca starch, wheat starch, corn starch and the like; those obtained from algae such as carrageenan, laminaran, seaweed mannan, glue plant, Irish moss, agar, sodium alginate and the like; vegetable mucilage such as hibicus, mannan, quince seed, pectin, tragacanth gum, Karaya gum, xanthin gum, gua bingahm, locust bingahm, gum arabic, carob gum, benzoin gum and the like; homo polysaccharides such as dextran, glucan, levan and the like; hetro polysaccharides such as succino glucan, suntan gum and the like; mucilages utilizing fermentation of microorganism; and proteins such as glue, gelatin, collagen sugar and the like.

Semi-natural materials (semi-synthetic products) include, in addition to alginic acid propylene glycol ester, cellulose derivatives such as viscose, methyl cellulose, ethyl cellulose, methylethyl cellulose, carboxymethyl cellulose, hydroxypropyl cellulose, hydroxypropylmethyl cellulose, hydroxypropylethyl cellulose, hydroxypropylmethyl cellulose phthalate and the like, and modified starches- The modified starches include roasted starches such as white dextrin, yellow dextrin and British gum; fermented and modified dextrins such as fermented dextrin and Sherdinger dextrin; α-starches such as acid-decomposed starch represented by solubilized starch, oxidized starch represented by dialdehyde starch, modified α-starch and non-modified α-starch; esterified starches such as starch phosphate, fatty acid starch, starch sulfate, starch nitrated, starch xanthate and starch carbamate; etherified starches such as carboxyalkyl starch, hydroxyalkyl starch, sulfa alkyl starch, cyanoethyl starch, allyl starch, benzyl starch, carbamylethyl starch and dialkylamino starch; crosslinked starches such as methylol crosslinked starch, hydroxyalkyl crosslinked starch, phosphoric acid crosslinked starch and dicarboxylic acid crosslinked starch; and starch graft copolymers such as starch/polyacrylamide copolymers, starch/polyacrylic acid copolymers, starch/polyvinyl acetate copolymers, starch/polyacrylonitrile copolymers, cationic starch/polyacrylic acid ester copolymers, cationic starch/vinyl polymer copolymers, starch/polystyrene maleic acid copolymers and starch/polyethylene oxide copolymers.

Examples of the synthetic product are, in addition to polyvinyl alcohol, modified polyvinyl alcohols such as partially acetalized polyvinyl alcohol, allyl-modified polyvinyl alcohol, polyvinyl methyl ether, polyvinyl ethyl ether and polyvinyl isobutyl ether, polyacrylic acid derivatives and polymethacrylic acid derivatives such as sodium polyacrylate, partially saponified polyacrylic acid ester, polymethacrylic acid salt and polyacrylamide, polyethylene glycol, polyethylene oxide, polyvinylpyrrolidone, polyvinylpyrrolidone/vinyl acetate copolymers, carboxyvinyl polymer, styrene/maleic acid copolymers, styrene/crotonic acid copolymers, sulfonic acid polymers described in Japanese Patent Publication No. 23982/1964 and phosphonic acid polymers described in Japanese Patent Publication No. 8907/1963. Furthermore, there are hydrophilic colloidal gum and a mixture of alginic acid and polyvinyl alcohol, as described in Japanese Patent Laid-Open Publication No. 17504/1972.

The hydrophilic processing solution used in the present invention includes various acids, alkalies and metal salts. The specified metal salt includes, for example, sodium, potassium, magnesium, calcium and zinc salts of phosphoric acid, nitric acid and chromic acid, sodium fluoride, potassium fluoride, fluorozirconic acid described in Japanese Patent Publication No. 22063/1961 and phospho/tungstic acid described in Japanese Patent Publication No. 7663/1964. In addition, there are a mixture of phosphoric acid/tetramethylenediamine described in Fr. 217033, phospho/-molybdenic acid compound described in OLS 2100217, a mixture of amorphous phosphoric acid compound/silicate/borane compound or a mixture of phosphoric acid/fluorine, described in BP 882856, sodium allylsulfonate described in BP 2098627 and trihydroxybenzalsulfonic acid described in Japanese Patent Publication No. 6410/1969. Moreover, a silicate can be used represented by the general formula $mSiO_2/nM_2O$ (M: alkali metal, m/n=0.5 to 8.5). Specifically, as the silicate, sodium silicate, potassium silicate, lithium silicate and the like can be used. The silicate used in the present invention is present in a proportion of about 0.4 to 40% by weight, preferably about 0.8 to 25% by weight to the whole hydrophilic processing solution. When using the silicate in the hydrophilic processing solution of the present invention, the pH is generally in the range of 8 to 14, preferably 9 to 13.

In the present invention, a surfactant, organic solvent, wetting agent, preservatives, etc. can optionally be added to the hydrophilic processing solution. Of the above described hydrophilic processing agent, in particular, gum arabic, $mSiO_2/nM_2O$, dextrin, hydroxyalkyl crosslinked starch, sodium polyacrylate, hydroxypropyl cellulose, hydroxypropyl ether cellulose and carboxymethyl cellulose are more effective. More particularly, $mSiO_2/nM_2O$ is markedly effective.

The hydrophilic processing solution used in the present invention contains various compounds, as described above, and for example, the hydrophilic processing solution of emulsion type, described in US Patent Nos. 4253999, 4268613 and 4348954, can also be used.

The construction of the lithographic printing plate coated with a photopolymer, used in the present invention, will be illustrated. As the base plate of the lithographic printing plate coated with a photopolymer, used in the present invention, the same material as in the foregoing electrophotographic printing plate is used. For the light-sensitive material, there are used photodecomposable light-sensitive materials described in "Shin-Kankosei Jushi (New Light-Sensitive Resin)", light-crosslinking light-sensitive materials, light-polymerizable light-sensitive materials, etc. In addition, plasticizers, surfactants, matting agents and various additives can optionally be added so as to improve the flexibility or coated surface state of the light-sensitive layer.

As the liquid developer of the present invention, a same solution as the etching solution used for etching the foregoing electrophotographic printing plate can be used. As the hydrophilic processing agent, a same material as the hydrophilic processing agent used in the hydrophilic processing treatment of the electrophotographic printing plate can also be used.

Printing results by a printing plate prepared using the means for preventing the end parts of the electrophotographic lithographic printing plate of the present invention from contamination will be illustrated in detail with conditions for making the printing plate.

EXAMPLE 1

An aluminum sheet of JIS 1050 was subjected to sand setting by a revolving nylon brush using a pumice-water suspension as a polishing agent. During the same time, the surface roughness (average roughness round central line) was 0.5 μm. The aluminum sheet was washed with water, then immersed in a 10% aqueous solution of sodium hydroxide at 70° C. and etched to give an aluminum etched quantity of 6 $g/m^2$. After washing with water, the aluminum sheet was immersed in a 30% aqueous solution of nitric acid for 1 minute and adequately washed with water. The aluminum sheet was then subjected to an electrolytic coarsening treatment for 20 seconds in a 0.7% aqueous solution of nitric acid using an alternating rectangular wave form with a voltage of 13 V at anode and 6 V at cathode (described in Japanese Patent Publication No. 19191/1980), then immersed in a 20% aqueous solution of sulfuric acid at 50° C. to clean the surface thereof and washed with water. The aluminum sheet was further subjected to an anode oxidation treatment in a 20% aqueous solution of sulfuric acid to give an anode-oxidized oxide film weight of 3.0 $g/m^2$, washed with water and dried to prepare a base plate.

A dispersion for a photoconductive layer was prepared by charging 1.0 g of an x-type non-metallic phthalocyanine (Fastogen Blue 8120 -commercial namemade by Dai-Nippon Ink Kogyo KK), 10.0g of a copolymer of butyl methacrylate and methacrylic acid (methacrylic acid 30 mole %), 60g of tetrahydrofuran and 40g of cyclohexanone in a glass vessel of 500 ml with glass beads and dispersed by means of a paint shaker (made by Toyo Seiki Seisakojo KK). The thus obtained coating liquid for a photoconductive layer was coated onto the base plate by a bar coater and dried at 120° C. for 10 minutes to prepare an electrophotographic printing plate having a film thickness, on dry basis, of 4 μm.

Printing results by a printing plate prepared using the means for preventing the end parts of the electrophotographic lithographic printing plate of the present invention from contamination will be illustrated in detail with conditions for making the printing plate.

A sample was statically charged to give a surface potential of +300 V by a corona charging device in a dark room, exposed by the apparatus shown in FIG. 4 and then subjected to a reversal development by applying a bias voltage of +200 V to faced electrodes using a liquid developer to obtain a clear positive image. The liquid developer had been prepared by dispersing 6 g of copolymer grains of styrene/vinyl toluene/lauryl methacrylate (grain size: 0.4 μm), as toner grains, in 1000 ml of Isopar H (commercial name, made by Esso Standard Co.), to which 2.3 g of a solution of zirconium naphthenate, as a charge controlling agent, was added. The resulting image was further heated at 140° C. for 10 minutes to fix the image and both the end parts of the lithographic printing plate having the toner fixed were subjected to beveling by the revolving cutter means.

The printing plate was then etched with a mixture of a liquid developer for a PS plate DN-3C (commercial name, made by Fuji Photo Film Co.) and water in a proportion of 1:1 by the apparatus shown in FIG. 7 and the end parts thereof were treated with a hydrophilic processing agent having the following composition, coated with a gum liquid consisting of a mixture of a gum for a PS plate GU-7 (commercial name, made by Fuji Photo Film Co.) and water in a proportion of 1:1 and dried to prepare an offset printing plate (Hereinafter, "gum liquid" means a mixture of a gum for a PS plate GU-7 (commercial name, made by Fuji Photo Film Co.) and water in a proportion of 1:1.).

This printing plate was set in an offset printing machine and subjected to printing, thus obtaining a good print free from stains on the printing end parts.

| Hydrophilic Processing Solution (1) | |
|---|---|
| Potassium Silicate (52 Be: 20° C.) | 25 g |
| Potassium Hydroxide (48.5%) | 15 g |
| Sodim Butylnaphthalenesulfonate | 5 g |
| Pure Water | 925 g |

EXAMPLE 2

The electrophotographic light-sensitive material of Example 1 was subjected to processings of statically charging, exposing, developing, fixing, beveling, and etching in an analogous manner to Example 1, and then subjected to treating the end parts with a hydrophilic processing solution having the following composition, coating with the gum liquid and drying to prepare an offset printing plate.

This printing plate was set in an offset printing machine and subjected to printing, thus obtaining a good print free from stains on the printing end parts.

| Hydrophilic Processing Solution (2) | |
|---|---|
| Cream Dextrin with Water-Soluble Content of at least 95 weight % (Cream Dextrin No. 3, commercial name, made by Matsutani Kagaku KK.) | 100 g |
| Potassium Silicate (52 Be: 20° C.) | 20 g |
| Potassium Hydroxide (48.5%) | 10 g |
| Sodim Isopropylnaphthalenesulfonate | 5 g |
| Pure Water | 865 g |

COMPARATIVE EXAMPLE 1

The electrophotographic light-sensitive material of Example 1 was subjected to processings of statically charging, exposing, developing, fixing, beveling, and etching in an analogous manner to Example 1. Then the sample was subjected to, without hydrophilic processing, coating with the gum liquid and drying to prepare an offset printing plate.

When this printing plate was set in an offset printing machine and subjected to printing, the resulting print had stains on the end parts thereof, in part, due to the insufficient beveling.

COMPARATIVE EXAMPLE 2

The electrophotographic light-sensitive material of Example 1 was subjected to processings of statically charging, exposing, developing, fixing, beveling, and etching in an analogous manner to Example 1. Then the sample was subjected to, without hydrophilic processing, drying to prepare an offset printing plate.

When this printing plate was set in an offset printing machine and subjected to printing, the resulting print had marked stains on the end parts thereof.

COMPARATIVE EXAMPLE 3

The electrophotographic light-sensitive material of Example 1 was subjected to processings of statically charging, exposing, developing and fixing. Then the printing plate was subjected to, without beveling of the end parts thereof, to etching and, without hydrophilic processing, to drying to prepare an offset printing plate.

When this printing plate was set in an offset printing machine and subjected to printing, the resulting print had marked stains on the end parts thereof.

EXAMPLE 3

The electrophotographic light-sensitive material of Example 1 was subjected to processings of statically charging, exposing, developing, fixing and beveling in an analogous manner to Example 1, and then subjected to etching with an etching solution consisting of 35 g of potassium silicate and 15 g of potassium hydroxide diluted with 690 ml of water, coating with the gum liquid and drying to prepare an offset printing plate, using the apparatus shown in FIG. 8.

This printing plate was set in an offset printing machine and subjected to printing, thus obtaining a good print free from stains on the printing end parts.

Printing results by a printing plate prepared using the means for preventing the end parts of the lithographic printing plate coated with a photopolymer from contamination will be illustrated in detail with conditions for making the printing plate.

EXAMPLE 4

A PS plate FNN (commercial name, made by Fuji Photo Film Co.) coated with a photopolymer was exposed by a negative copy for surface exposure and treated by the apparatus shown in FIG. 9. That is, the plate was subjected to beveling of the end parts by the revolving cutter means, developed by a mixture of a liquid developer for a PS plate DN-3C (commercial name, made by Fuji Photo Film Co.) and water in a proportion of 1:1, subjected to treating of the end parts thereof with a hydrophilic processing solution having the following composition, coated with the gum liquid and dried to prepare an offset printing plate.

This printing plate was set in an offset printing machine and subjected to printing, thus obtaining a good print free from stains on the printing end parts.

| Hydrophilic Processing Solution (3) | |
|---|---|
| Sodium Polyacrylate | 40 g |
| Potassium Silicate (52 Be: 20° C.) | 20 g |
| Potassium Hydroxide (48.5%) | 10 g |
| Sodim Butylnaphthalenesulfonate | 5 g |
| Pure Water | 925 g |

EXAMPLE 5

The lithographic printing plate of Example 1 was subjected to processings of surface exposing, beveling and developing in an analogous manner to Example 1, and then subjected to treating the end parts of the printing plate with a hydrophilic processing solution having the following composition, coating with the gum liquid and drying to prepare an offset printing plate.

This printing plate was set in an offset printing machine and subjected to printing, thus obtaining a good print free from stains on the printing end parts.

| Hydrophilic Processing Solution (4) | |
|---|---|
| Carboxymethylated Starch (incorporation ratio of carboxymethyl group 0.2) | 100 g |
| Potassium Silicate (52 Be: 20° C.) | 20 g |
| Potassium Hydroxide (48.5%) | 10 g |
| Sodim Isopropylnaphthalenesulfonate | 5 g |
| Pure Water | 865 g |

COMPARATIVE EXAMPLE 4

The lithographic printing plate of Example 1 was subjected to processings of surface exposing, beveling and developing in an analogous manner to Example 1, and then subjected to, without hydrophilic processing, coating with the gum liquid and drying to prepare an offset printing plate.

When this printing plate was set in an offset printing machine and subjected to printing, the resulting print had stains on the end parts thereof, in part, due to the insufficient beveling.

COMPARATIVE EXAMPLE 5

The lithographic printing plate of Example 1 was subjected to processings of surface exposing, beveling and developing in an analogous manner to Example 1, and then subjected to, without hydrophilic processing and coating with the gum liquid, drying to prepare an offset printing plate.

When this printing plate was set in an offset printing machine and subjected to printing, the resulting print had marked stains on the end parts thereof.

COMPARATIVE EXAMPLE 6

The lithographic printing plate of Example 4 was subjected to surface exposing in an analogous manner to Example 1, and then developed without beveling of the end parts. The plate was then subjected to, without hydrophilic processing and coating with the gum liquid, to drying to prepare an offset printing plate.

When this printing plate was set in an offset printing machine and subjected to printing, the resulting print had marked stains on the end parts thereof.

EXAMPLE 6

A PS plate FNN (commercial name, made by Fuji Photo Film Co.) coated with a photopolymer was exposed by a negative copy for surface exposure, subjected to beveling of the end parts thereof, then developed by a mixture of a liquid developer for a PS plate DP-4 (commercial name, made by Fuji Photo Film Co.) and water in a proportion of 1:20, coated with the gum liquid and dried to prepare an offset printing plate.

This printing plate was set in an offset printing machine and subjected to printing, thus obtaining a good print free from stains on the printing end parts.

Advantages of the Invention

As illustrated above, according to the present invention, a lithographic printing plate having no printing stain at the end parts thereof can be provided by subjecting the end parts of the lithographic printing plate transported in a predetermined direction by a transporting means to a beveling treatment and then to a hydrophilic processing of the beveled parts.

What is claimed is:

1. A process for the production of a lithographic printing plate, which comprises subjecting a lithographic printing plate transported in a predetermined direction by a transporting means to a beveling treatment of end parts thereof and then subjecting the beveled parts to a treatment for rendering hydrophilic.

2. The process for the production of a lithographic printing plate, as claimed in claim 1, wherein the lithographic printing plate is prepared by steps of, at least, statically charging, exposing, developing with a toner, fixing the toner and removing a photoconductive layer other than the toner image.

3. The process for the production of a lithographic printing plate, as claimed in claim 2, wherein the beveling treatment is carried out in any step after the toner development.

4. The process for the production of a lithographic printing plate, as claimed in claim 1, wherein the lithographic printing plate is a printing plate coated with a photopolymer.

5. The process for the production of a lithographic printing plate, as claimed in claim 4, wherein the beveling treatment is carried out in any step after coating of the photopolymer.

6. The process for the production of a lithographic printing plate, as claimed in claim 1, wherein the beveling treatment is carried out by revolving cutting.

7. The process for the production of a lithographic printing plate, as claimed in claim 1, wherein the treatment for rendering hydrophilic is carried out with a hydrophilic processing agent.

8. The process for the production of a lithographic printing plate, as claimed in claim 7, wherein the hydrophilic processing agent is at least one member selected from the group consisting of hydrophilic polymers, acids and alkalies.

* * * * *